United States Patent
Zhang et al.

(10) Patent No.: US 11,973,141 B2
(45) Date of Patent: Apr. 30, 2024

(54) NANOSHEET TRANSISTOR WITH FERROELECTRIC REGION

(71) Applicant: International Business Machines Corporation, Armonk, NY (US)

(72) Inventors: Jingyun Zhang, Albany, NY (US); Reinaldo Vega, Mahopac, NY (US); Miaomiao Wang, Albany, NY (US); Takashi Ando, Eastchester, NY (US)

(73) Assignee: International Business Machines Corporation, Armonk, NY (US)

( * ) Notice: Subject to any disclaimer, the term of this patent is extended or adjusted under 35 U.S.C. 154(b) by 291 days.

(21) Appl. No.: 17/397,068

(22) Filed: Aug. 9, 2021

(65) Prior Publication Data
US 2023/0041159 A1 Feb. 9, 2023

(51) Int. Cl.
| | |
|---|---|
| *H01L 29/66* | (2006.01) |
| *H01L 21/02* | (2006.01) |
| *H01L 21/8238* | (2006.01) |
| *H01L 27/092* | (2006.01) |
| *H01L 29/06* | (2006.01) |
| *H01L 29/423* | (2006.01) |

(Continued)

(52) U.S. Cl.
CPC .... *H01L 29/78391* (2014.09); *H01L 21/0259* (2013.01); *H01L 21/823807* (2013.01); *H01L 21/823814* (2013.01); *H01L 21/823857* (2013.01); *H01L 27/092* (2013.01); *H01L 29/0665* (2013.01); *H01L 29/42392* (2013.01); *H01L 29/66545* (2013.01); *H01L 29/66742* (2013.01); *H01L 29/6684* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 7,728,369 B2 | 6/2010 | Kang | |
| 8,385,098 B2 | 2/2013 | Hong | |

(Continued)

FOREIGN PATENT DOCUMENTS

| | | | |
|---|---|---|---|
| CN | 109904219 A | 6/2019 | |
| CN | 109904235 A | 6/2019 | |

(Continued)

OTHER PUBLICATIONS

English Translation of JP 2004119693 A; 2004 (Year: 2004).*

(Continued)

*Primary Examiner* — Suberr L Chi
*Assistant Examiner* — Carnell Hunter, III
(74) *Attorney, Agent, or Firm* — Matthew Zehrer

(57) ABSTRACT

A nanosheet semiconductor device includes a first ferroelectric region between a channel nanosheet stack and a gate contact. The channel nanosheet stack includes a plurality of channel nanosheets each connected to a source and connected to a drain and a gate surrounding the plurality of channel nanosheets and connected to the source and connected to the drain. The nanosheet semiconductor device may further include a second ferroelectric region upon a sidewall of the channel nanosheet stack. Sidewalls of the first ferroelectric region may be substantially coplanar with or inset from underlying sidewalls of the channel nanosheet stack.

19 Claims, 11 Drawing Sheets

(51) Int. Cl.
  *H01L 29/78*    (2006.01)
  *H01L 29/786*    (2006.01)

(56) References Cited

U.S. PATENT DOCUMENTS

| | | | |
|---|---|---|---|
| 9,263,592 B2 | 2/2016 | Lee | |
| 9,923,055 B1* | 3/2018 | Cheng | H01L 29/0665 |
| 10,374,086 B2 | 8/2019 | Hu | |
| 10,804,410 B2 | 10/2020 | Chao | |
| 2008/0017934 A1* | 1/2008 | Kim | H01L 29/0657 257/E29.022 |
| 2017/0162702 A1* | 6/2017 | Hu | H01L 29/42384 |
| 2019/0096767 A1* | 3/2019 | Yeh | H01L 21/823431 |
| 2020/0027959 A1* | 1/2020 | Cheng | B82Y 10/00 |
| 2020/0303208 A1 | 9/2020 | Xu | |
| 2020/0357884 A1* | 11/2020 | Xie | H01L 29/165 |
| 2020/0357931 A1* | 11/2020 | Lee | H01L 29/36 |
| 2021/0249506 A1* | 8/2021 | Yeh | H01L 29/1079 |
| 2021/0305389 A1* | 9/2021 | Liaw | H01L 21/823431 |
| 2021/0336038 A1* | 10/2021 | Zhang | H01L 29/78696 |
| 2021/0359103 A1* | 11/2021 | Xie | H01L 29/4238 |
| 2021/0375685 A1* | 12/2021 | Xie | H01L 21/823418 |
| 2022/0165731 A1* | 5/2022 | Huang | H01L 29/6684 |
| 2022/0190167 A1* | 6/2022 | Ando | H01L 21/823842 |
| 2022/0278195 A1* | 9/2022 | Ando | H01L 29/786 |

FOREIGN PATENT DOCUMENTS

| | | | |
|---|---|---|---|
| CN | 109904236 A | | 6/2019 |
| CN | 110707152 A | | 1/2020 |
| JP | 2004119693 A | * | 4/2004 ........... H01L 27/105 |

OTHER PUBLICATIONS

"Stacked Nanosheet Gate-All-Around Transistor to Enable Scaling Beyond FinFET," Loubet et al., 2017 Symposium on VLSI Technology Digest of Technical Papers.

H. Ota et al., "Perspective of negative capacitance FinFETs investigated by transient TCAD simulation," 2017 IEEE International Electron Devices Meeting (IEDM), 2017, pp. 15.2.1-15.2.4, doi: 10.1109/IEDM.2017.8268394.

* cited by examiner

NANOSHEET TRANSISTOR WITH FERROELECTRIC REGION

BACKGROUND

Various embodiments of the present application generally relate semiconductor device fabrication methods and resulting structures. More specifically the various embodiments relate to a nanosheet transistor that includes a ferroelectric region that may be included within a metal-ferroelectric-metal-insulator-semiconductor (MFMIS) gate.

SUMMARY

In an embodiment of the present invention, a nanosheet semiconductor device is presented. The nanosheet semiconductor device includes a first channel nanosheet stack. The first channel nanosheet stack includes a first plurality of channel nanosheets each connected to a source and connected to a drain and a first internal gate surrounding the first plurality of channel nanosheets. The nanosheet semiconductor device further includes a first ferroelectric region that includes an inner surface directly upon at least a portion of an outer surface of the first internal gate. The nanosheet semiconductor device further includes a gate directly upon an outer surface of the first ferroelectric region.

In an embodiment of the present invention, a semiconductor device fabrication method is presented. The method includes forming a first channel nanosheet stack. The first channel nanosheet stack includes a plurality of channel nanosheets each connected to a source and connected to a drain, a sacrificial cap connected to the source and connected to the drain, a lower internal gate region surrounding the plurality of channel nanosheets, and an upper internal gate region surrounding the sacrificial cap. The method further includes, subsequent to forming the channel nanosheet stack, forming a first ferroelectric region between the lower internal gate region and the upper internal gate region.

In another embodiment of the present invention, a nanosheet semiconductor device is presented. The nanosheet semiconductor device includes a substrate, a high-k dielectric layer upon the substrate, and a channel nanosheet stack upon the high-k layer. The channel nanosheet includes a plurality of channel nanosheets each connected to a source and connected to a drain and an internal gate surrounding the plurality of channel nanosheets. The nanosheet semiconductor device further includes a first ferroelectric region directly upon an upper surface of the internal gate and a second ferroelectric region directly upon a sidewall of the internal gate. The nanosheet semiconductor device further includes a dielectric spacer directly upon the sidewall of the internal gate surrounding channel nanosheet stack and aligned with the second ferroelectric region.

These and other embodiments, features, aspects, and advantages will become better understood with reference to the following description, appended claims, and accompanying drawings.

DETAILED DESCRIPTION

Figure 1:
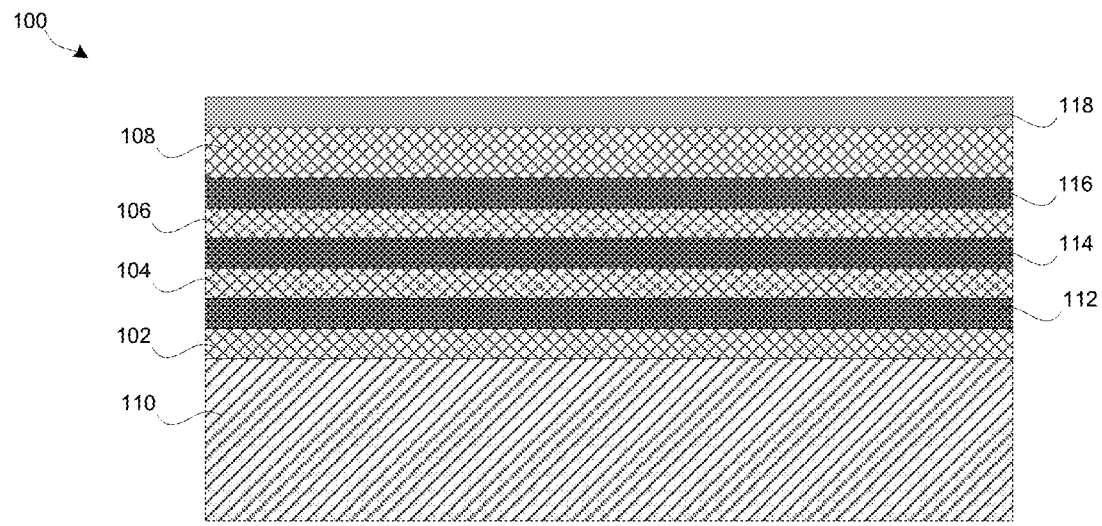
FIG. 1 depicts a cross-section view of a semiconductor structure after a fabrication operation, in accordance with one or more embodiments.

It is understood in advance that although a detailed description is provided herein of an exemplary n-type "wrap-around" or "gate-all-around" (GAA) nanosheet FET architecture having silicon (Si) channel nanosheets and silicon germanium (SiGe) sacrificial nanosheets, implementation of the teachings recited herein are not limited to the particular FET architecture described herein. Rather, embodiments of the present invention are capable of being implemented in conjunction with any other type of FET device now known or later developed, including, for example, p-type GAA nanosheet FET architectures having silicon germanium channel nanosheets and silicon sacrificial nanosheets.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, or ±2% difference between the coplanar materials.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices can be formed in the active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate. The gate and the body are spaced apart by a gate dielectric layer. The channel connects the source and the drain, and electrical current flows through the channel from the source to the drain. The electrical current flow is induced in the channel region by a voltage applied at the gate.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, the previously described GAA nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets may be silicon (Si) and the sacrificial nanosheets may be silicon germanium (SiGe). For p-type FETs, the channel nanosheets may be SiGe and the sacrificial nanosheets may be Si. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven nanometer (nm) technology and below.

Voltage scaling in these devices can be provided by introducing negative capacitance (NC) effect. The NC effect arises from the series combination of a ferroelectric (FE) and dielectric, in this case contained within a gate region. For GAA FETs, capacitance matching, between the FE and the underlying MOS capacitance, may be desirable.

One or more embodiments of the invention also provide fabrication methods and resulting gate structures that contain a ferroelectric region upon or within the gate to allow for capacitance matching, which may be a prerequisite for a negative capacitance transistor. If adequate capacitance matching is achieved, then the subthreshold swing of the transistor is reduced and can enable a reduction in the operating voltage. The same effect will also increase transconductance in the on-state of the transistor, which is beneficial to logic voltage gain as well as analog circuit operation.

Fabrication methods and resulting semiconductor device structures, in accordance with embodiments of the invention, are described in detail below by referring to the accompanying drawings.

FIG. 1 depicts a cross-sectional view of a semiconductor structure 100 after initial fabrication operations, according to embodiments of the invention. The initial fabrication operations include forming a substrate 110, forming alternating layers of sacrificial nanosheets 102, 104, 106, 108 and channel nanosheets 112, 114, and 116, configured and arranged as shown, and forming a sacrificial cap layer 118 upon the sacrificial nanosheet layer 108.

Non-limiting examples of suitable materials for the substrate 110 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb). The substrate 110 can be a bulk semiconductor material that includes Si.

In some embodiments of the invention, the channel nanosheets 112, 114, and 116 are formed from silicon (Si), and the sacrificial nanosheets 102, 104, 106, 108 are formed from silicon germanium (SiGe). The channel nanosheets 112, 114, and 116 can include, for example, monocrystalline Si. The channel nanosheets 112, 114, and 116 can have a thickness of, for example, from about 4 to about 10 nm, from about 4 to about 7 nm, or of about 7 nm. In embodiments where the sacrificial nanosheets 102, 104, 106, 108 include SiGe, for example, SiGe having a Ge concentration of about 50 atomic percent. The sacrificial nanosheets 102, 104, 106 can have a thickness of, for example, about 12 nm. The sacrificial nanosheet layer 108 has a thickness greater than sacrificial nanosheets 102, 104, 106. For example, sacrificial nanosheet layer 108 has a thickness 1-3 times as the thickness of nanosheets 102, 104, 106.

Sacrificial capping layer 118 may be formed of the same material as nanosheets 112, 114, and 116.

In some embodiments, the alternating series of sacrificial nanosheets 102, 104, 106, 108, channel nanosheets 112, 114, and 116, and sacrificial capping layer 118 are formed by epitaxially growing one layer and then the next until the desired number and desired thicknesses of such layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methyl silane, dimethylsilane, ethyl silane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 2A:
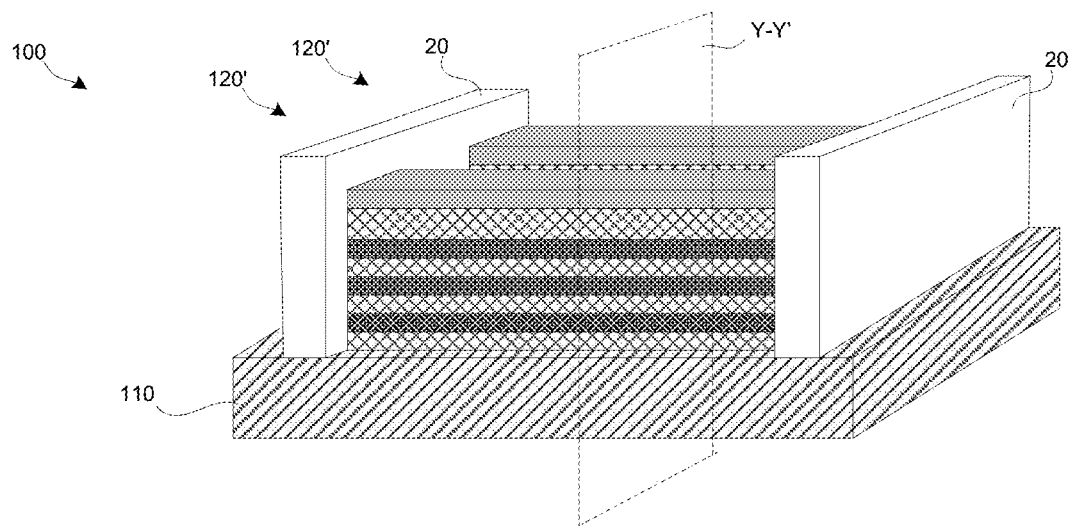
FIG. 2A depicts a perspective view of the semiconductor structure after a fabrication operation, in accordance with one or more embodiments.

FIG. 2A depicts a perspective view of the semiconductor structure 100 after formation of source and drain (S/D) regions 20 and after patterning and removal of portions of the sacrificial nanosheets 102, 104, 106, 108, removal of portions of the channel nanosheets 112, 114, and 116, and removal of portions of the sacrificial capping layer 118 so as to expose portions of the substrate 108, during an intermediate fabrication operation according to one or more embodiments.

The S/D regions 20 can be formed using epitaxial growth processes of the type previously described herein. As previously described, materials can be epitaxially grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from 1×1019 cm−3 to 2×1021 cm−3, or preferably between 2×1020 cm3 and 1×1021 cm−3.

The removal of undesired portions of sacrificial nanosheets 102, 104, 106, 108, removal of undesired portions of the channel nanosheets 112, 114, and 116, and removal of undesired portions of the sacrificial capping layer 118 can be accomplished using, for example, a sidewall image transfer (SIT) operation, a wet etch process, or a dry etch process. The removal of such undesired portions expose portions of the top surface of the substrate 110.

Desired portions of sacrificial nanosheets 102, 104, 106, 108, desired portions of the channel nanosheets 112, 114, and 116, and desired portions of the sacrificial capping layer 118 may be retained and generally form respective sacrificial nanosheet stacks 120'. A sacrificial nanosheet stack 120' includes one or more sacrificial portions. For example, sacrificial nanosheet stack 120' includes a sacrificial cap 118 formed from the sacrificial capping layer 118. Further fabrication stages are described herein that describe the removal and replacement of such sacrificial portions so as to form a nanosheet stack 120, depicted for example in FIG. 9A, 9B. The generic term "nanosheet stack" may be utilized herein and may refer to the sacrificial nanosheet stack 120' and/or nanosheet stack 120, as appropriate.

Figure 2B:
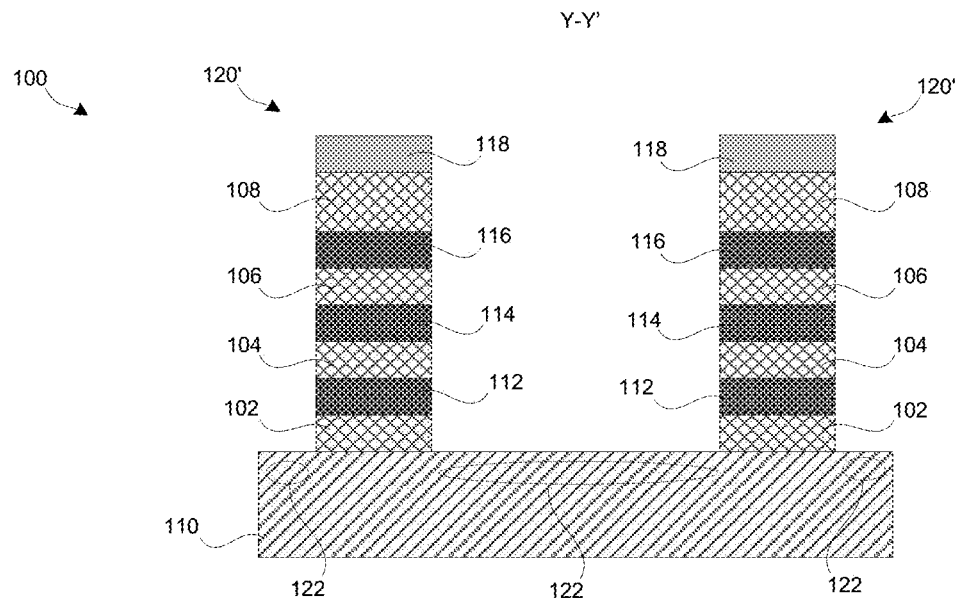
FIG. 2B depicts cross-sectional view of the semiconductor structure shown in FIG. 2A, taken along plane Y-Y', in accordance with one or more embodiments.

FIG. 2B depicts cross-sectional view of the semiconductor structure 100 shown in FIG. 2A, taken along plane Y-Y', through the width of neighboring nanosheet stacks within a gate region, in accordance with one or more embodiments. FIG. 2B further depicts substrate 110 including one or more shallow trench isolation (STI) regions 122 within the substrate 110 adjacent to or outside the footprint of the nanosheet stacks.

Figure 3:
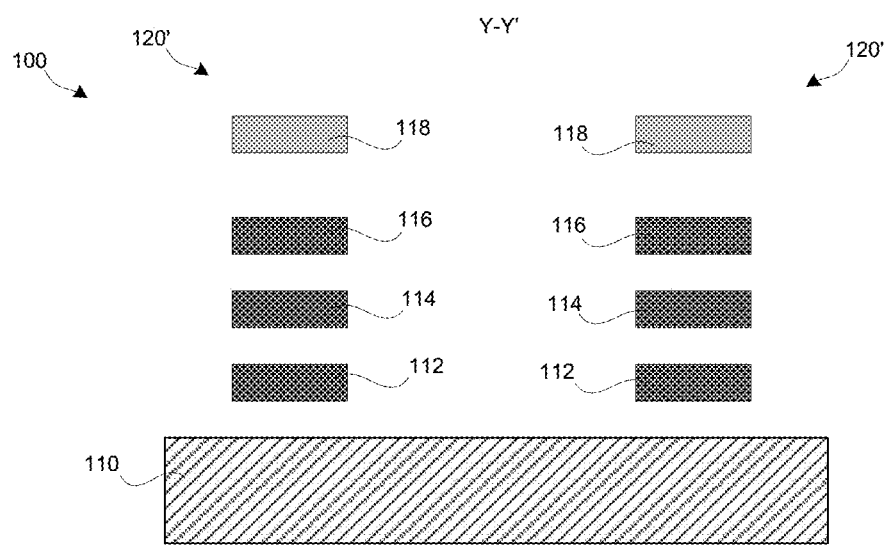
FIG. 3 depicts cross-sectional view of the semiconductor structure shown after a fabrication operation, taken along plane Y-Y', in accordance with one or more embodiments.

FIG. 3 depicts the Y-Y' view of the semiconductor structure 100 after a fabrication operation, according to one or more embodiments of the present invention. As depicted in FIG. 3, in a channel release operation, the sacrificial nanosheets 102, 104, 106, 108 have been removed by a known etching process, e.g., ME, chemical oxide removal (COR), selective HCl gas etching, etc. Because the thickness of sacrificial nanosheet 108 being greater relative to the thickness of sacrificial nanosheets 102, 104, 106, there is a larger dimension or gap between nanosheet 116 and sacrificial cap 118 relative to the dimension or gap between nanosheets 112 and 114 and between nanosheets 114 and 116, respectively. The channel nanosheets 112, 114, and 116, and the sacrificial cap 118 may be anchored by the source/drain regions 20.

Figure 4:
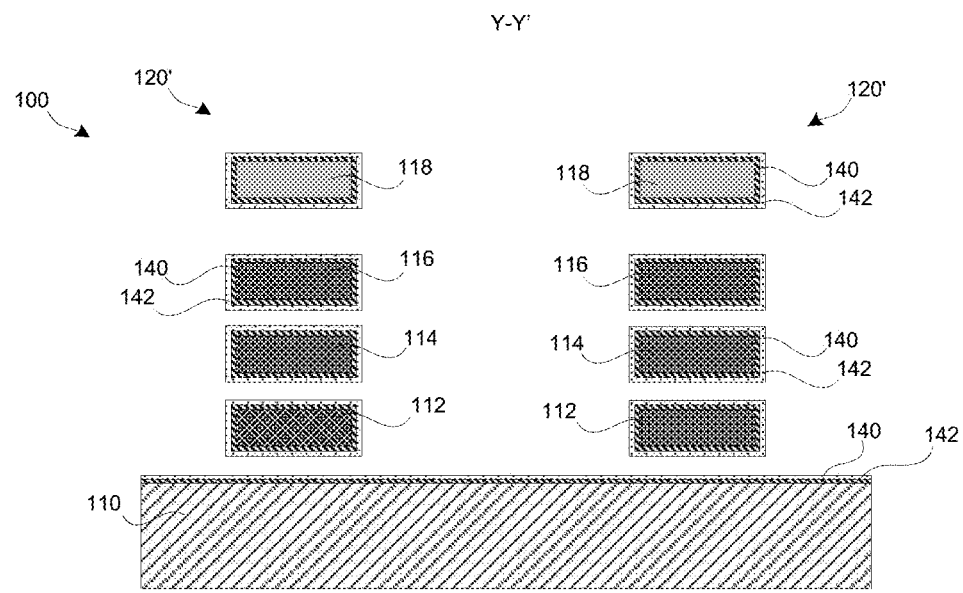
FIG. 4 depicts cross-sectional view of the semiconductor structure shown after a fabrication operation, taken along plane Y-Y', in accordance with one or more embodiments.

FIG. 4 depicts the Y-Y' view of the semiconductor structure 100 after a fabrication operation, according to one or more embodiments of the present invention. As depicted in FIG. 4, a high-k dielectric layer 140 and work function layer 142 are sequentially deposited around the channel nanosheets 112, 114, and 116, are sequentially deposited around sacrificial cap 118, and are sequentially deposited upon the substrate 110.

The high-k dielectric layer 140 is formed from a dielectric material with a higher dielectric constant relative to silicon dioxide. The high-k dielectric 140 can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the high-k dielectric layer 140 can have a thickness of from about 0.5 nm to about 4 nm. In some embodiments, the high-k dielectric layer 140 can have a thickness of from about 2 nm to about 3 nm, although other thicknesses are within the contemplated scope of the invention.

Work function layer 142 is a layer formed upon the high-k dielectric layer 140. The work function layer 142 can be made of one or more work function materials, such as, for example, aluminum, lanthanum oxide, magnesium oxide, strontium titanate, strontium oxide, titanium nitride, titanium aluminum nitride, titanium aluminum carbide, tantalum nitride, and combinations thereof. In some embodiments, work function layer 142 can have a thickness of from about 0.5 nm to about 4 nm. In some embodiments, work function layer 142 can have a thickness of from about 2 nm to about 3 nm, although other thicknesses are within the contemplated scope of the invention.

Generally, the combined high-k dielectric layer 140 and work function layer 142 are adequately thin layers such that a gap exists between the work function layer 142 material above substrate 110 and the work function layer 142 material around channel nanosheet 112, such that a gap exists between respective work function layer 142 materials around adjacent channel nanosheets, and such that a gap exists between the work function layer material 142 around channel nanosheet 116 and the work function layer material 142 around sacrificial cap 118.

Figure 5:
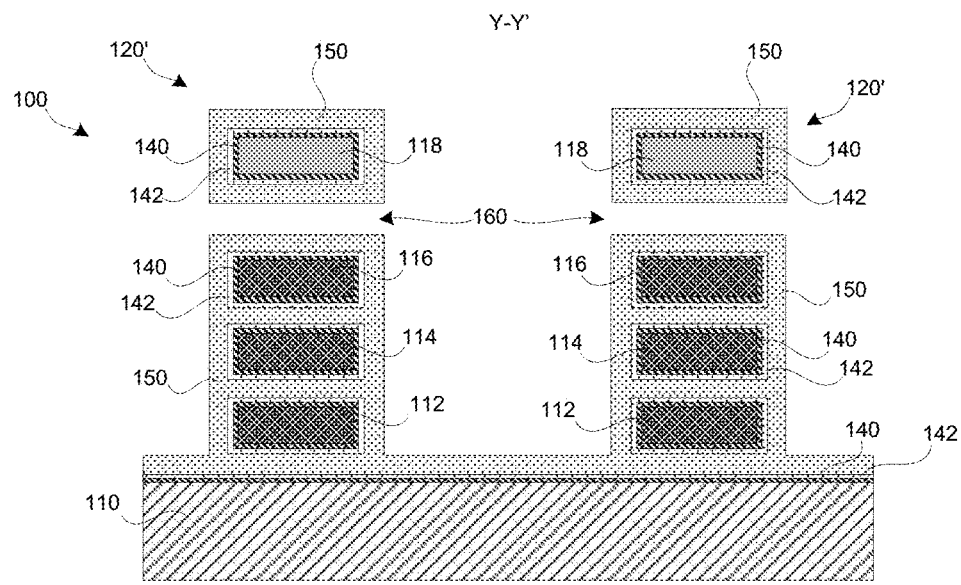
FIG. 5 depicts cross-sectional view of the semiconductor structure shown after a fabrication operation, taken along plane Y-Y', in accordance with one or more embodiments.

FIG. 5 depicts the Y-Y' view of the semiconductor structure 100 after a fabrication operation, according to one or more embodiments of the present invention. As depicted in FIG. 5, gate material 150 is deposited on the work function layer 142. Gate material 150 may also be referred to herein as internal gate material, internal gate, or the like.

The gate material 150 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

In some embodiments, gate material 150 can have a thickness of from about 2 nm to about 10 nm, although other thicknesses are within the contemplated scope of the invention. Generally, gate material 150 is an adequately thick layer such that the gate material 150 is pinched off (gate material 150 fills the gap) between substrate 110 and channel nanosheet 112, is pinched off between channel nanosheet 112 and channel nanosheet 114 and is pinched off between channel nanosheet 114 and channel nanosheet 116. In addition, gate material 150 is an adequately thin layer to leave a gap 160 between the gate material 150 around channel nanosheet 116 and the gate material 150 around the sacrificial cap 118.

In some implementations, it is beneficial for high-k dielectric 140 and work function layer 142 to be formed as depicted. In these instances, the high-k dielectric 140 and work function layer 142 modifies the work function of the gate material 150. In other implementations, high-k dielectric 140 and work function layer 142 may be absent. In these implementations, the gate material 150 may be formed directly around channel nanosheets 112, 114, and 116 and may be formed directly around sacrificial cap 118.

In some implementations, the gate material 150 and work function layer 142 materials above the STI regions 122 adjacent to or outside the footprint of the nanosheet stacks may be retained (as depicted). In other implementations, the gate material 150 and work function layer 142 materials above the STI regions 122 adjacent to or outside the footprint of the nanosheet stacks may be removed (shown for example in FIG. 7B). Removal of the undesired gate material 150 and undesired work function layer 142 material may be accomplished using, for example, a reactive ion etch, a wet etch process, or a dry etch process.

The gate material 150 and work function layer 142 materials that are around the channel nanosheets and around the sacrificial cap 118 may become integral or generally apart of the nanosheet stack(s).

As depicted, the internal gate material 150 may be effectively formed around the channel nanosheet 112, 114, and 116 portion of the nanosheet stacks. Such portion of the gate material 150 may be referred to herein as the lower internal gate region. Similarly, internal gate material 150 may be effectively formed around the sacrificial cap 118 portion of the nanosheet stacks. Such portion of the gate material 150 may be referred to herein as the upper internal gate region.

Figure 6:
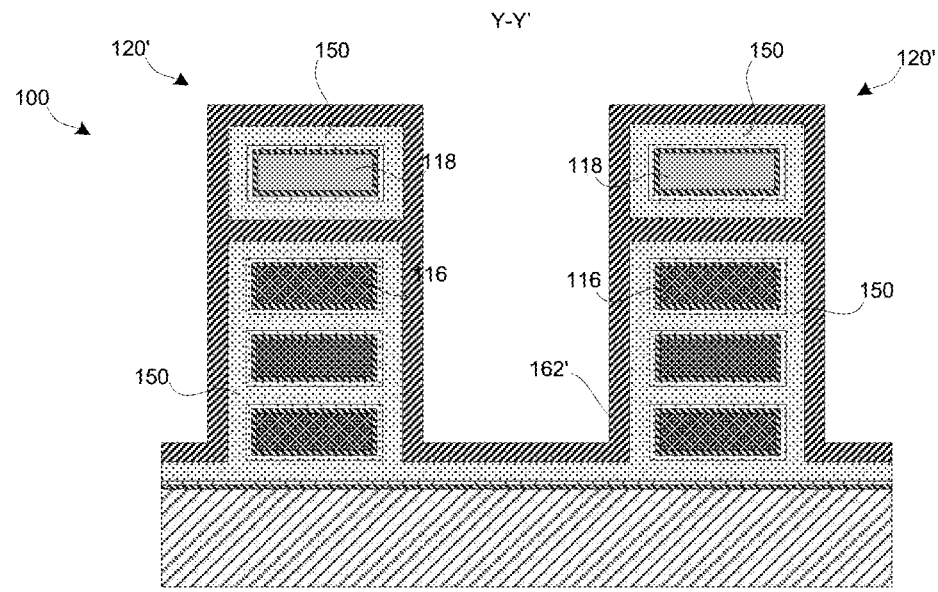
FIG. 6 depicts cross-sectional view of the semiconductor structure shown after a fabrication operation, taken along plane Y-Y', in accordance with one or more embodiments.

FIG. 6 depicts the Y-Y' view of the semiconductor structure 100 after a fabrication operation, according to one or more embodiments of the present invention. As depicted in FIG. 6, ferroelectric layer 162' is deposited on the gate material 150.

Ferroelectric layer 162' is a dielectric material layer. Due to the integral ferroelectric material, the ferroelectric layer 162' exhibits electric polarization that can be reversed by the application of an electric field. Examples of ferroelectric material include hafnium oxide ($HfO_2$), barium titanate (BTO), barium strontium titanate (BST), lead titanate (LTO), lead zirconate titanate (PZT), lead lanthanum zirconate titanate (PLZT), lead magnesium niobate (PMN), potassium niobate, potassium sodium niobate, etc.

Ferroelectric layer 162' typically has an exceptionally high dielectric constant. For example, ferroelectric layer may have an order of magnitude higher dielectric constant relative to silicon dioxide. The apparent dielectric constant is field dependent, being highest when switching between polarization states.

In some embodiments, ferroelectric layer 162' can have a thickness of from about 0.5 nm to about 8 nm. In some embodiments, ferroelectric layer 162' can have a thickness of from about 2 nm to about 4 nm, although other thicknesses are within the contemplated scope of the invention. Generally, ferroelectric layer 162' is an adequately thick layer such that the ferroelectric layer 162' is pinched off between the gate material 150 around sacrificial cap 118 and the gate material 150 around channel nanosheet 116.

Ferroelectric layer 162' is an adequately thick layer such that the ferroelectric layer 160' is formed to fill gap 160. Further, the ferroelectric layer 162' may be further formed upon the gate material 150 located upon the sidewalls of the nanosheet stacks. Further, the ferroelectric layer 162' may be further formed upon the gate material 150 located above the STI regions 122 adjacent to or outside the footprint of the nanosheet stacks.

Figure 7A:
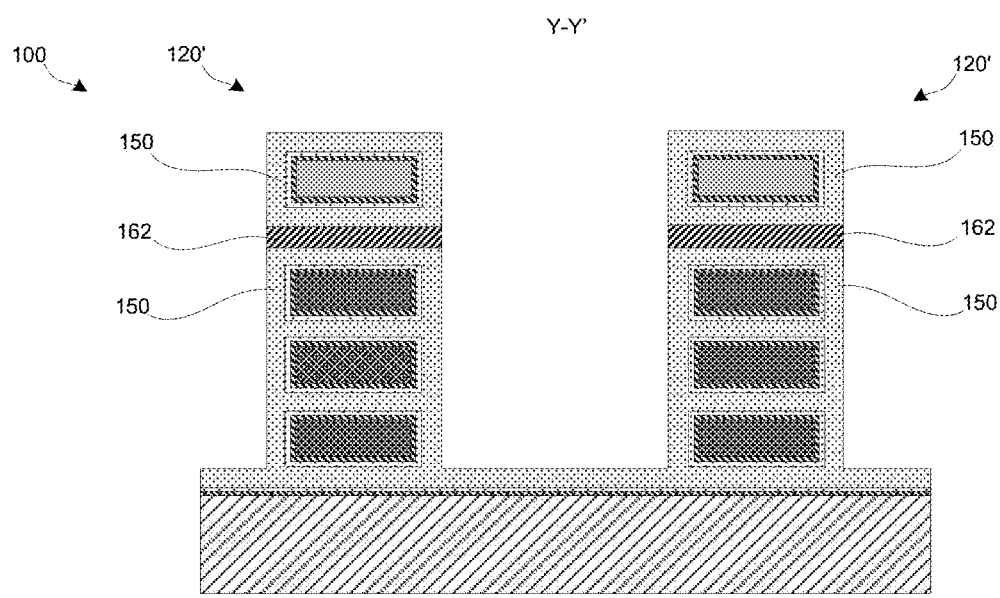
FIG. 7A depicts cross-sectional view of the semiconductor structure shown after a fabrication operation, taken along plane Y-Y', in accordance with one or more embodiments.

FIG. 7A depicts the Y-Y' view of the semiconductor structure 100 after a fabrication operation, according to one or more embodiments of the present invention. As depicted in FIG. 7A, undesired portions of ferroelectric layer 162' are removed while desired portions of ferroelectric layer 162' to form ferroelectric region 162.

The removal of undesired portions of ferroelectric layer 162' can be accomplished using, for example, a reactive ion etch, a wet etch process, or a dry etch process. The removal of such undesired portions of ferroelectric layer 162' expose underlying portions of gate material 150, high-k material 140, or the like, while desired portions of ferroelectric layer 162' are retained at least within gap 160. In other implementations, desired portions of ferroelectric layer 162' may be further retained within gap 160 and retained upon the sidewalls of the gate material 150 of the nanosheet stack, as depicted FIG. 7B.

Figure 11:
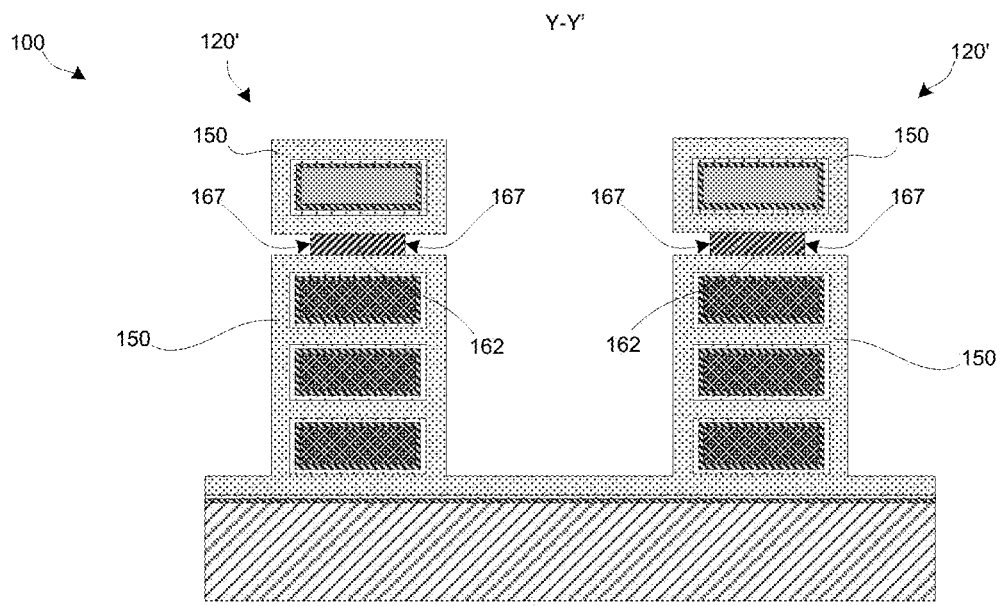
FIG. 11 depicts cross-sectional view of the semiconductor structure shown after a fabrication operation, taken along plane Y-Y', in accordance with one or more embodiments.

In implementations as depicted, ferroelectric region 162 may be formed within the sacrificial nanosheet stack 120'. The side surfaces of ferroelectric region 162 may be coplanar or substantially coplanar with the side surface(s) of gate material 150 of the nanosheet stack. In other words, the side surfaces of a nanosheet stack 120' may be coplanar or substantially coplanar. In other implementations, the side surfaces of ferroelectric region 162 may be inset from the side surface(s) of gate material 150 of the nanosheet stack, as is depicted in FIG. 11.

In order to achieve capacitance matching, the negative capacitance of the ferroelectric regions 162 equals the positive capacitance of the total gate-to-channel capacitance between the gate material 150 and underlying channel nanosheets 112, 114, and 116. The negative capacitance of the ferroelectric is typically much higher, per unit area, so therefore the total area of the ferroelectric regions 162 may be smaller than the total channel area of the channel nanosheets 112, 114, and 116. For example, suppose the widths and thicknesses of channel nanosheets 112, 114, and 116 were each 50 nm and 5 nm, respectively. This would result in a total cross-sectional channel perimeter of 330 nm per stack. If the negative capacitance of a ferroelectric region 162, per unit area, is 6.6× larger than the positive capacitance per unit area of said stack, then an appropriate width of a ferroelectric region 162 would be 330 nm divided by 10, or 50 nm per channel stack in this example. This 50 nm width exactly matches the 50 nm width of the channel stack and so a ferroelectric region 162 can be placed atop said channel stack at a width of 50 nm, forming a MFMIS structure between the gate 30, ferroelectric region 162, gate material 150, high-k dielectric 140 and work function layer 142, and channel nanosheets 112, 114, and 116.

Figure 7B:
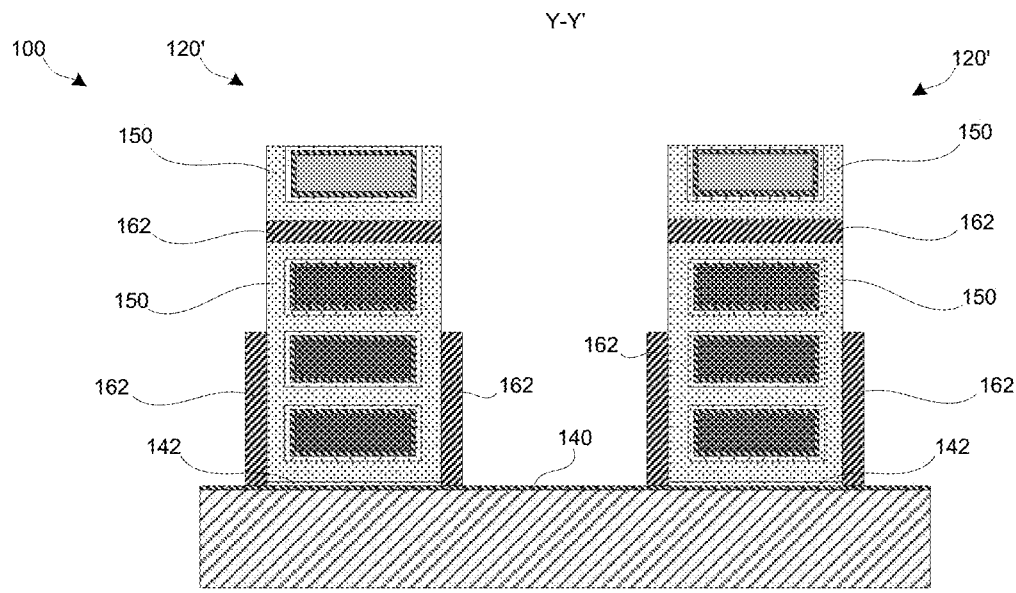
FIG. 7B depicts cross-sectional view of the semiconductor structure shown after a fabrication operation, taken along plane Y-Y', in accordance with one or more embodiments.

FIG. 7B depicts the Y-Y' view of an alternative implementation of semiconductor structure 100, which may be referred herein to semiconductor structure 100', after a fabrication operation, according to one or more embodiments of the present invention. The semiconductor structure 100' includes a respective ferroelectric region 162 upon the top surface and a sidewall surface of the nanosheet stack. As depicted in FIGS. 7B, undesired portions of ferroelectric layer 162' are removed while desired portions of ferroelectric layer 162', thereby forming ferroelectric regions 162.

It may be beneficial for semiconductor structure 100' fabrication that undesired portions of gate material 150 and undesired portions of work function layer 142 located above the STI regions 122 adjacent to or outside the footprint of the nanosheet stacks may be removed prior to formation of the ferroelectric layer 162.

The removal of undesired portions of ferroelectric layer 162' can be accomplished using, for example, an incomplete reactive ion etch, an incomplete wet etch process, or an incomplete dry etch process. The removal of such undesired portions of ferroelectric layer 162' may expose e.g., high-k dielectric 140 above the STI regions 122 outside the footprint or adjacent to sacrificial nanosheet stacks 120'. The removal of undesired portions of ferroelectric layer 162' may further expose sidewall portions of the sacrificial nanosheet stack 120'. As these multiple ferroelectric regions 162 are formed from ferroelectric layer 162' and undergo the same processes to remove undesired ferroelectric layer 162' material, these multiple ferroelectric regions 162 may be simultaneously formed.

Desired portions of ferroelectric layer 162' are retained within gap 160 and upon the sidewall(s) the sacrificial nanosheet stacks 120'. As depicted in FIG. 7B, the side surfaces of ferroelectric region 162 and the side surfaces of work function layer 142 within the sacrificial nanosheet stack 120', may be coplanar or substantially coplanar with the side surface(s) of the sacrificial nanosheet stack 120'. In other words, the side surfaces of a nanosheet stack 120' may be coplanar or substantially coplanar. In some implementations, the thickness of the ferroelectric region 162 on the sidewall of the sacrificial nanosheet stack 120' may be thicker than the ferroelectric region 162 within the sacrificial nanosheet stack 120', due to the geometrical constraints associated with gap 160.

In order to achieve capacitance matching, the negative capacitance of the ferroelectric regions 162 equals the positive capacitance of the total gate-to-channel capacitance between the gate material 150 and underlying channel nanosheets 112, 114, and 116. The negative capacitance of the ferroelectric regions 162 is typically much higher, per unit area, so therefore the total area of the ferroelectric regions 162 may be smaller than the total channel area of the channel nanosheets 112, 114, and 116. For example, suppose the widths and thicknesses of channel nanosheets 112, 114, and 116 were each 50 nm and 5 nm, respectively. This would result in a total cross-sectional channel perimeter of 330 nm per stack. If the negative capacitance of a ferroelectric region 162, per unit area, is 5× larger than the positive capacitance per unit area of said stack, then an appropriate width of a ferroelectric region 162 would be 330 nm divided by 6, or 66 nm per channel stack in this example. This 66 nm width is larger than 50 nm width of the channel stack and so a ferroelectric region 162 can be divided into two equal pieces places along opposite channel stack sidewalls, each being 33 nm tall, forming a MFMIS structure between the gate 30, ferroelectric region 162, internal gate material 150, high-k dielectric 140 and work function layer 142, and channel nanosheets 112, 114, and 116.

Figure 8A:
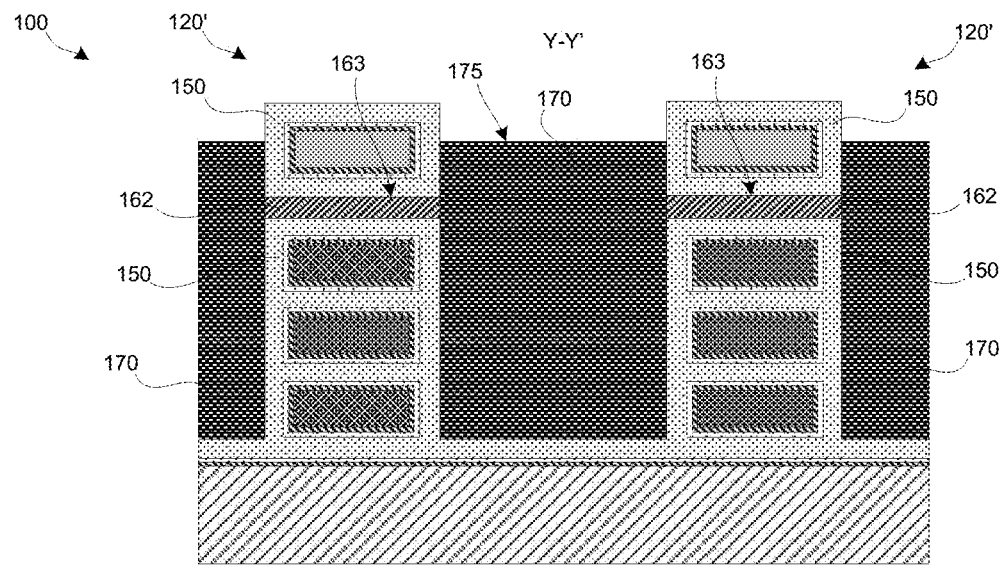
FIG. 8A depicts cross-sectional view of the semiconductor structure shown after a fabrication operation, taken along plane Y-Y', in accordance with one or more embodiments.
Figure 8B:
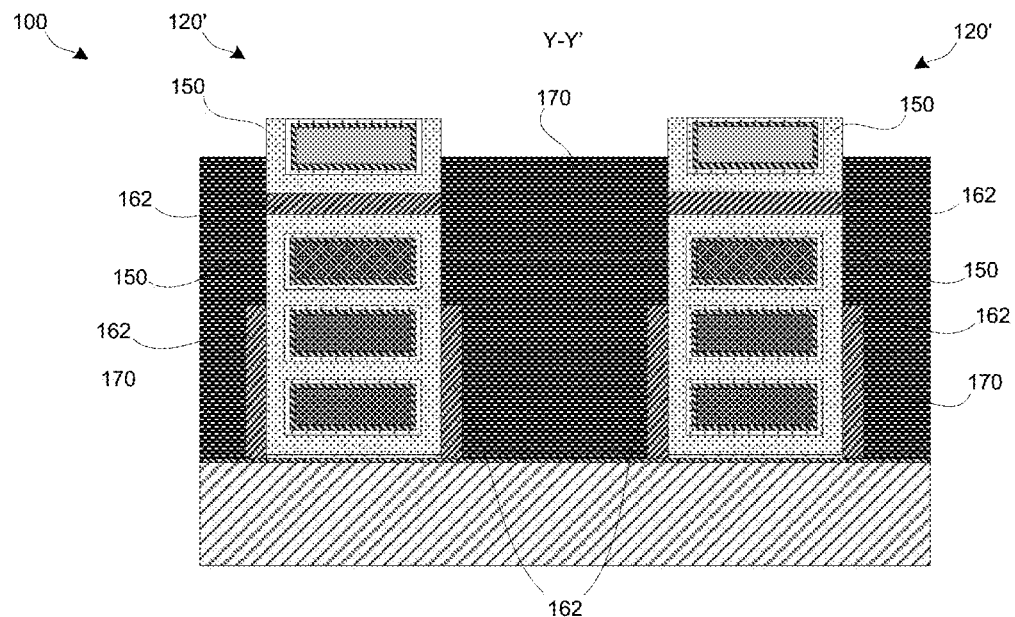
FIG. 8B depicts cross-sectional view of the semiconductor structure shown after a fabrication operation, taken along plane Y-Y', in accordance with one or more embodiments.

FIG. 8A depicts the Y-Y' view of semiconductor structure 100 and FIG. 8B depicts the Y-Y' view of the semiconductor structure 100' after a fabrication operation, according to one or more embodiments of the present invention. As depicted in FIGS. 8A and 8B, a dielectric layer 170 is deposited.

As is shown in FIG. 8A, dielectric layer 170 may be formed upon gate material 150 and upon the sidewalls of ferroelectric region 162 within sacrificial nanosheet stack 120'. As is shown in FIG. 8B, dielectric layer 170 may be formed upon high-k layer 140, upon ferroelectric regions 162 that are located on the sidewall(s) of nanosheet stack 120', upon gate material 150 of nanosheet stack 120', and upon the sidewalls of the ferroelectric regions 162 located within sacrificial nanosheet stack 120'.

Dielectric layer 170 can be formed of known dielectric material(s), such as, for example, silicon dioxide, silicon nitride, or the like. Dielectric layer 170 may be formed to a thickness to result in an upper surface 175 of dielectric layer 170 being above an upper surface 163 of the ferroelectric region 162 that is located within the sacrificial nanosheet stack 120'.

Figure 9A:
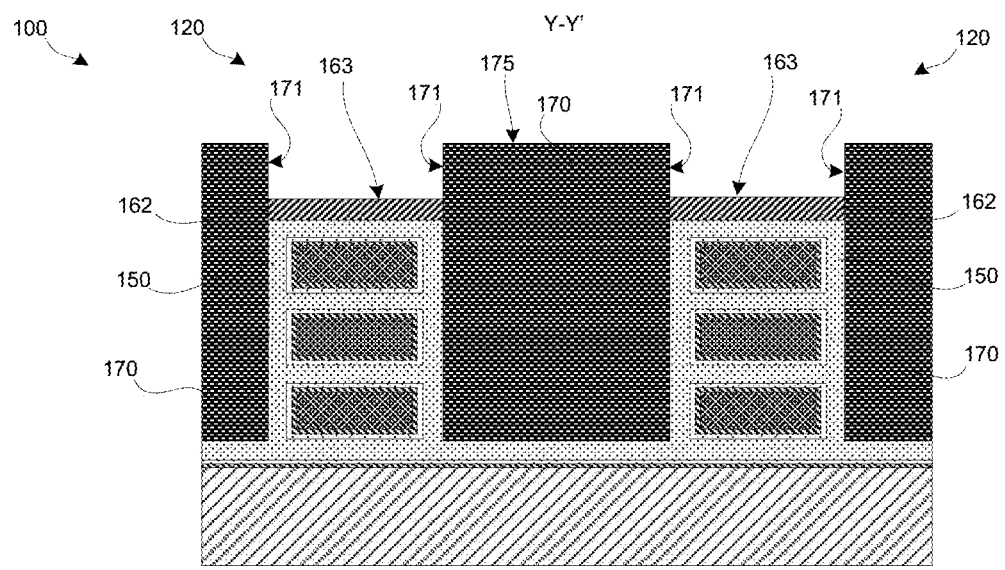
FIG. 9A depicts cross-sectional view of the semiconductor structure shown after a fabrication operation, taken along plane Y-Y', in accordance with one or more embodiments.

FIG. 9A depicts the Y-Y' view of the semiconductor structure 100 after a fabrication operation, according to one or more embodiments of the present invention. As depicted in FIG. 9A, undesired portions of sacrificial nanosheet stack 120' above ferroelectric region 162 are removed, thereby forming nanosheet stack 120. Nanosheet stack 120 may generally include features that are retained (i.e. not sacrificial) in further fabrication of the semiconductor structure.

The removal of undesired portions of sacrificial nanosheet stack 120' can be accomplished using, for example, a reactive ion etch, or the like, of the sacrificial cap layer 118 and the layer(s) (e.g., high-k dielectric layer 140, work function layer 142, etc.) that are surrounding the sacrificial cap layer 118. Removal of the sacrificial nanosheet stack 120' that is above ferroelectric region 162 may expose the upper surface 163 of ferroelectric region 162 and may expose facing sidewalls 171 of the portion of dielectric layer 170 formed above the ferroelectric region 162.

Figure 9B:
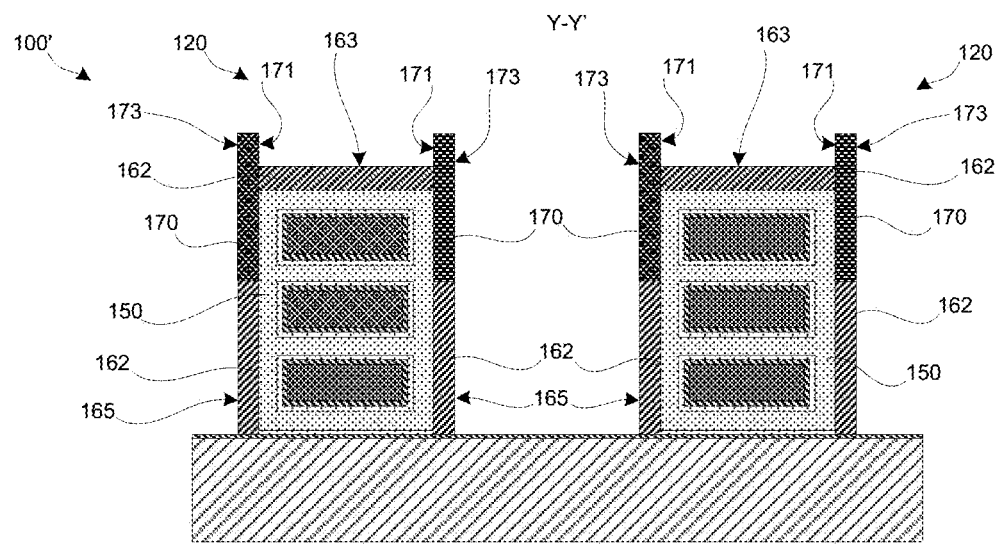
FIG. 9B depicts cross-sectional view of the semiconductor structure shown after a fabrication operation, taken along plane Y-Y', in accordance with one or more embodiments.

FIG. 9B depicts the Y-Y' view of the semiconductor structure 100' after a fabrication operation, according to one or more embodiments of the present invention. As depicted in FIGS. 9B, undesired portions of sacrificial nanosheet stack 120' above ferroelectric region 162 are removed, thereby forming nanosheet stack 120, and undesired portions of dielectric layer 170 are removed.

The removal of undesired portions of sacrificial nanosheet stack 120' can be accomplished using, for example, a reactive ion etch, or the like, of the sacrificial cap layer 118 and the layer(s) that are surrounding the sacrificial cap layer 118. Removal of the sacrificial nanosheet stack 120' that is above ferroelectric region 162 may expose the upper surface 163 of ferroelectric region 162 and may expose facing sidewalls 171 of the portion of dielectric layer 170 formed above the ferroelectric region 162.

The removal of undesired portions of dielectric layer 170 can be accomplished using, for example, a reactive ion etch, wet etch, dry etch, or the like, of the undesired portions of dielectric layer 170. Desired portions of dielectric layer 170 upon ferroelectric regions 162 and upon the sidewalls of the nanosheet stack 120 may be retained. Such retained portions of dielectric layer 170 may be referred herein as dielectric spacers 170. Dielectric spacers 170 may have a sidewall 173 that is coplanar or substantially coplanar with a sidewall 165 of the underlying ferroelectric region 162.

Figure 10A:
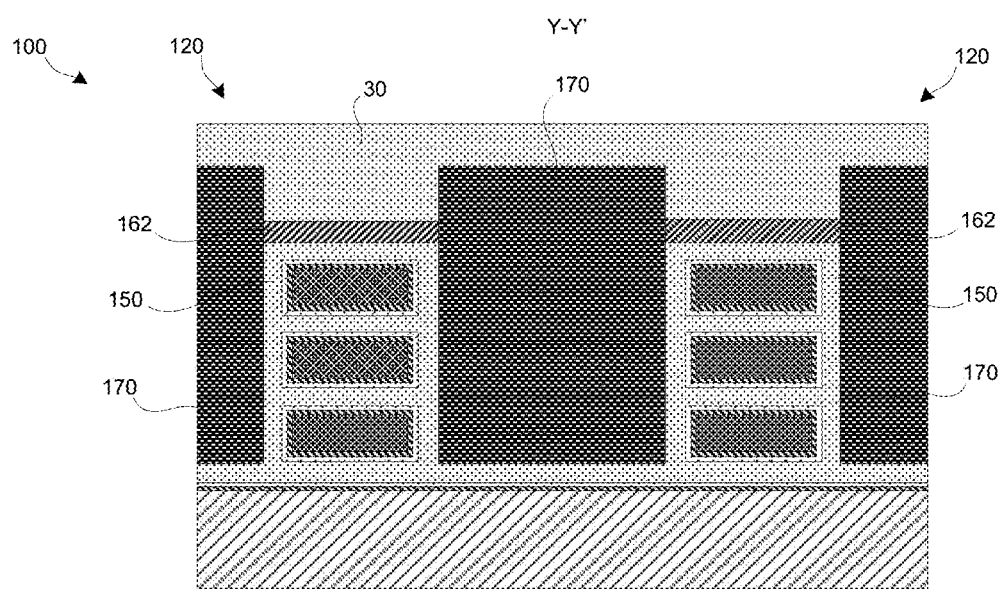
FIG. 10A depicts cross-sectional view of the semiconductor structure shown after a fabrication operation, taken along plane Y-Y', in accordance with one or more embodiments.

FIG. 10A depicts the Y-Y' view of the semiconductor structure 100 after a fabrication operation, according to one or more embodiments of the present invention. As depicted in FIG. 10A, gate 30 is formed upon the ferroelectric region 162 and upon the dielectric layer 170. In the embodiment depicted, the gate 30 is formed upon neighboring nanosheet stacks, such that the gate 30 is formed upon ferroelectric regions 162 of the neighboring inner gates. Such sharing of gate 30 by multiple nanosheet stacks is an important for some IC devices, such as NCFETs.

As depicted, the ferroelectric region 162 separates the gate material 150 of the nanosheet stack 120 and the gate 30. The separation between gate metals by the ferroelectric region 162 may be advantageous to allow for capacitance matching, which may be a prerequisite for a negative capacitance transistor. If adequate capacitance matching is achieved, then the subthreshold swing of the transistor is reduced and can enable a reduction in the operating voltage. The same effect will also increase transconductance in the on-state of the transistor, which is beneficial to logic voltage gain as well as analog circuit operation.

The gate 30 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. The gate 30 may be formed of the same or different material(s) as the gate material 150.

The associated gate 30, ferroelectric region 162, and internal gate material 150 may advantageously form a MFMIS gate. The gate 30 may also be referred to as an external gate, as opposed to the internal gate 150.

Figure 10B:
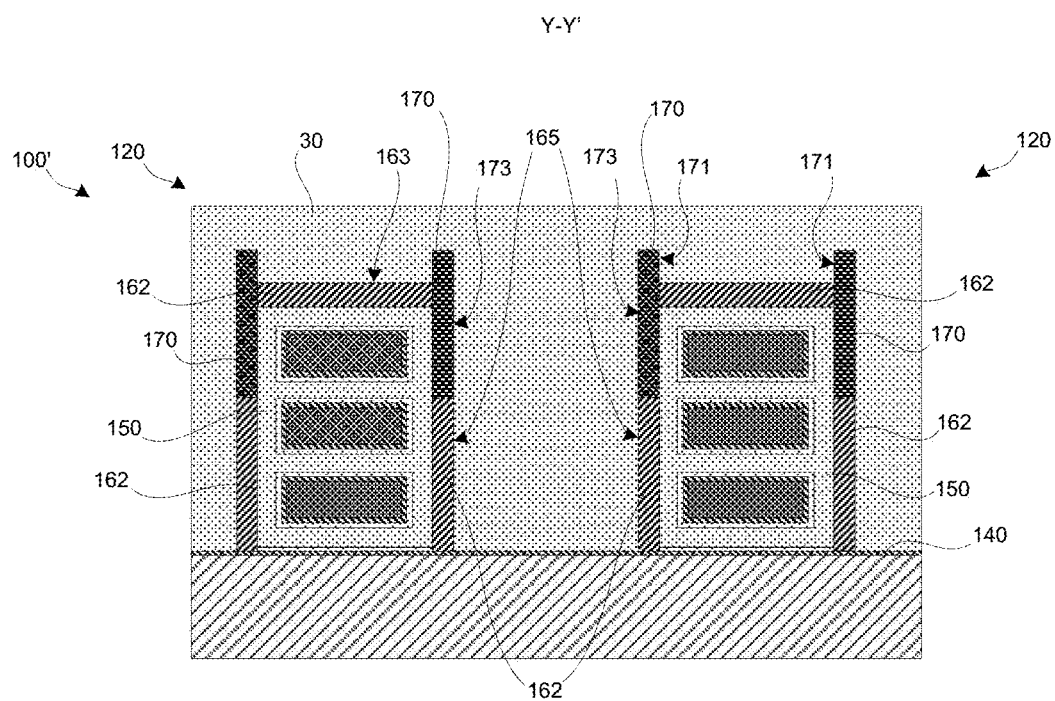
FIG. 10B depicts cross-sectional view of the semiconductor structure shown after a fabrication operation, taken along plane Y-Y', in accordance with one or more embodiments.

FIG. 10B depicts the Y-Y' view of the semiconductor structure 100' after a fabrication operation, according to one or more embodiments of the present invention. As depicted in FIGS. 10B, gate 30 may be formed upon the ferroelectric regions 162, upon the dielectric spacers 170, and upon high-k dielectric 140.

The ferroelectric region 162 that is located upon the upper surface of nanosheet stack 120, the ferroelectric region(s) 162 located upon the sidewall(s) of nanosheet stack, and the dielectric spacer(s) 170 generally separate the internal gate material 150 and the gate 30. The separation between gate metals by the ferroelectric region 162 and the dielectric spacer(s) 170 may be advantageous to allow for capacitance matching, which may be a prerequisite for a negative capacitance transistor. If adequate capacitance matching is achieved, then the subthreshold swing of the transistor is reduced and can enable a reduction in the operating voltage. The same effect will also increase transconductance in the on-state of the transistor, which is beneficial to logic voltage gain as well as analog circuit operation.

The associated gate 30, ferroelectric region(s) 162, and internal gate may advantageously form a MFMIS gate.

FIG. 11 depicts the Y-Y' view of an semiconductor structure 100 after a fabrication operation, according to one or more embodiments of the present invention. As depicted in FIG. 11 undesired portions of ferroelectric layer 162' are removed while desired portions of ferroelectric layer 162', thereby forming ferroelectric region 162. The present operation may be a similar operation as depicted in FIG. 7A and FIG. 7B.

The removal of undesired portions of ferroelectric layer 162' can be accomplished using, for example, a reactive ion etch, a wet etch process, or a dry etch process. The removal of such undesired portions of ferroelectric layer 162' expose underlying portions of gate material 150 while desired portions of ferroelectric layer 162' are retained within gap 160. The ferroelectric region 162 is generally the retained ferroelectric layer 162' material located within gap 160. As depicted in FIG. 11, the side surfaces 167 of ferroelectric region 162 may be inset from the side surface(s) of gate material 150 of the nanosheet stack.

Figure 12:
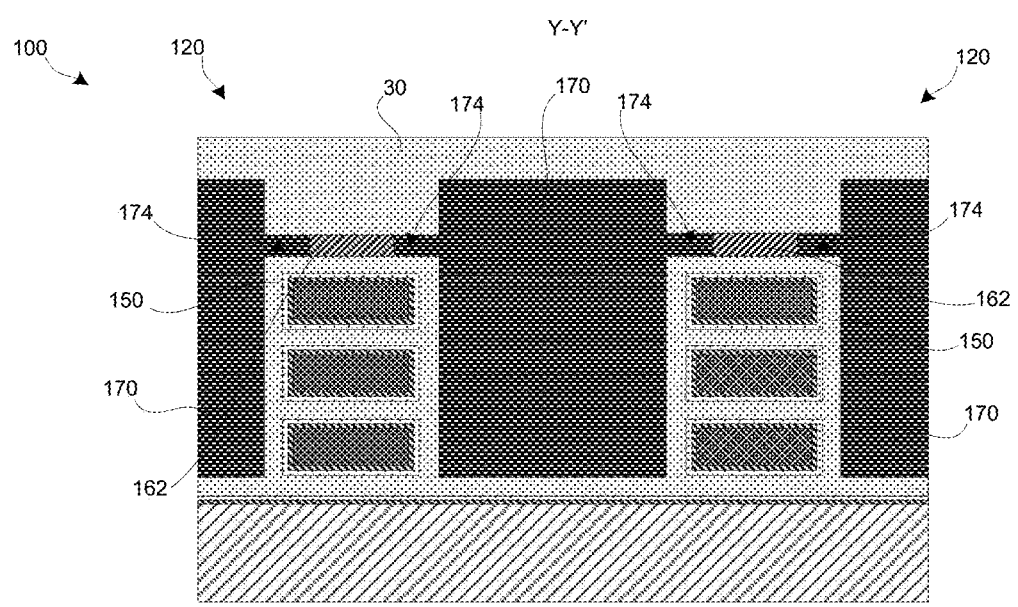
FIG. 12 depicts cross-sectional view of the semiconductor structure shown after a fabrication operation, taken along plane Y-Y', in accordance with one or more embodiments.

FIG. 12 depicts the Y-Y' view of an semiconductor structure 100 after a series fabrication operations, according to one or more embodiments of the present invention. The structure 100 depicted in FIG. 12 may undergo similar operations to those described and depicted in FIG. 8A, FIG. 9A, FIG. 10A, and FIG. 10B. Due to the inset side surfaces 167 of ferroelectric region 162, semiconductor structure 100 may include portions 174 of dielectric layer 170 (in addition to the ferroelectric region 162) between gate contact 50 and the gate material 150 of nanosheet stack 120.

In order to achieve capacitance matching, the negative capacitance of the ferroelectric regions 162 equals the positive capacitance of the total gate-to-channel capacitance between the gate material 150 and underlying channel nanosheets 112, 114, and 116. The negative capacitance of the ferroelectric region 162 is typically much higher, per unit area, so therefore the total area of the ferroelectric region 162 may be smaller than the total channel are of the channel nanosheets 112, 114, and 116. For example, suppose the widths and thicknesses of channel nanosheets 112, 114, and 116 were each 50 nm and 5 nm, respectively. This would result in a total cross-sectional channel perimeter of 330 nm per stack. If the negative capacitance of a ferroelectric region 162, per unit area, is 10× larger than the positive capacitance per unit area of said stack, then an appropriate width of a ferroelectric region 162 would be 330 nm divided by 10, or 33 nm per channel stack in this example. This 33 nm width fits within the 50 nm width of the channel stack and so a ferroelectric region 162 can be placed atop said channel stack at a width of 33 nm, forming a MFMIS structure between the top gate electrode 30, ferroelectric region 162, internal gate material 150, high-k dielectric layer 140 and work function layer 142, and channel nanosheets 112, 114, and 116.

For clarity, semiconductor structure may undergo further fabrication processes to fabricate an IC device. For example, a gate contact may be formed upon the gate 30, a source/drain contact may be formed upon source/drain 20, etc.

Figure 13:
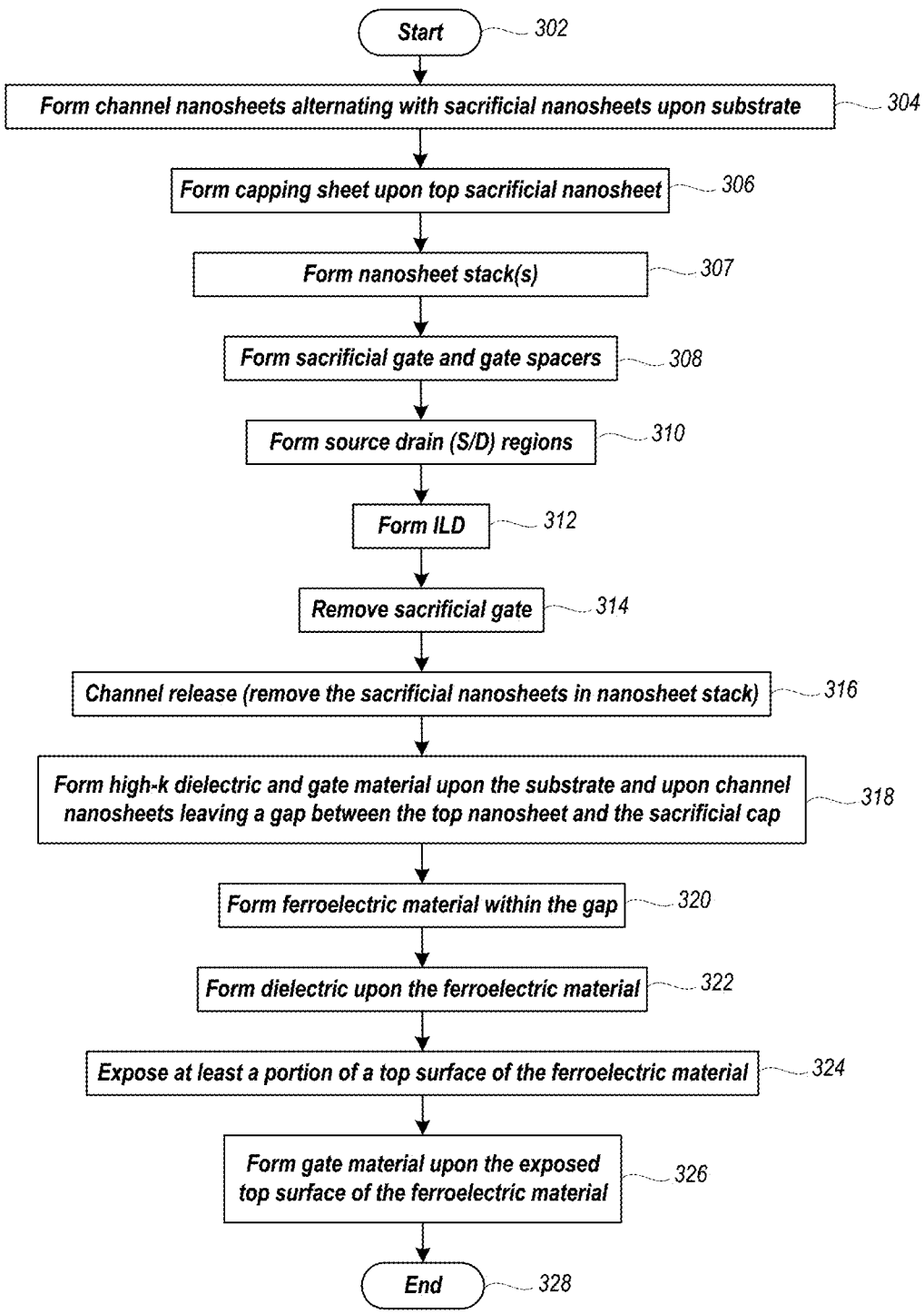
FIG. 13 is a flow diagram illustrating a semiconductor device fabrication method, in accordance with one or more embodiments.

FIG. 13 depicts a flow diagram illustrating a method 300 of fabricating the semiconductor structure 100 (e.g., the structure that includes ferroelectric region 160 between gate 30 and the gate material 150 of nanosheet stack 120), according to one or more embodiments of the present invention. As depicted in FIG. 13, the method 300 begins at block 302 and continues with forming channel nanosheets 112, 114, and 116 alternating with sacrificial nanosheets 102, 104, 106, and 108 upon substrate 110 (block 304). The thickness of sacrificial nanosheet 108 is generally larger than the thickness of the sacrificial nanosheets 102, 104, and 106 that separates channel nanosheets 112, 114, and 116, or the like.

At block 306, capping sheet 118 is formed upon sacrificial nanosheet 108. At block 307, nanosheet stacks may be patterned between S/D areas. At block 308, a sacrificial gate (not depicted) and gate spacers (not depicted) may be formed.

At block 310, source/drain regions 20 are formed upon substrate 110 within the source/rain areas. At block 312, an inter-layer dielectric (not depicted) may be formed and at block 314 the sacrificial gate may be removed.

At block 316, the sacrificial nanosheets 102, 104, 106, and 108 are removed, e.g., released, from the channel nanosheets 112, 114, 116 and removed, e.g., released, from sacrificial cap 118. At block 318, a high-k dielectric layer 140, work function layer 142, and gate material 150 are formed upon the substrate, formed around the channel nanosheets 112, 114, and 116, and formed around the sacrificial cap 118. A gap 160 is formed between the gate material 150 that is formed around channel nanosheet 116 and the gate material 150 that is formed around sacrificial cap 118.

At block 320, ferroelectric region 162 is formed at least within the gap 160. At block 322, dielectric layer 170 is formed upon the ferroelectric region 162 and may be formed upon sidewall(s) sacrificial nanosheet stack 120'. Upper surface 175 of dielectric 170 may be above upper surface 163 of ferroelectric region 162.

At block 324, the sacrificial cap 118 and the layers around sacrificial cap 118 (e.g., the high-k layer 140, the work function layer 142, and the gate material 150) are removed to expose the upper surface 163 of ferroelectric region 162. Upon removal of the sacrificial cap 118 and the layers around sacrificial cap 118, nanosheet stack 120 is formed. At block 326, gate material 30 is formed upon at least a portion of upper surface 163 of ferroelectric region 162. Method 300 may end at block 328.

Figure 14:
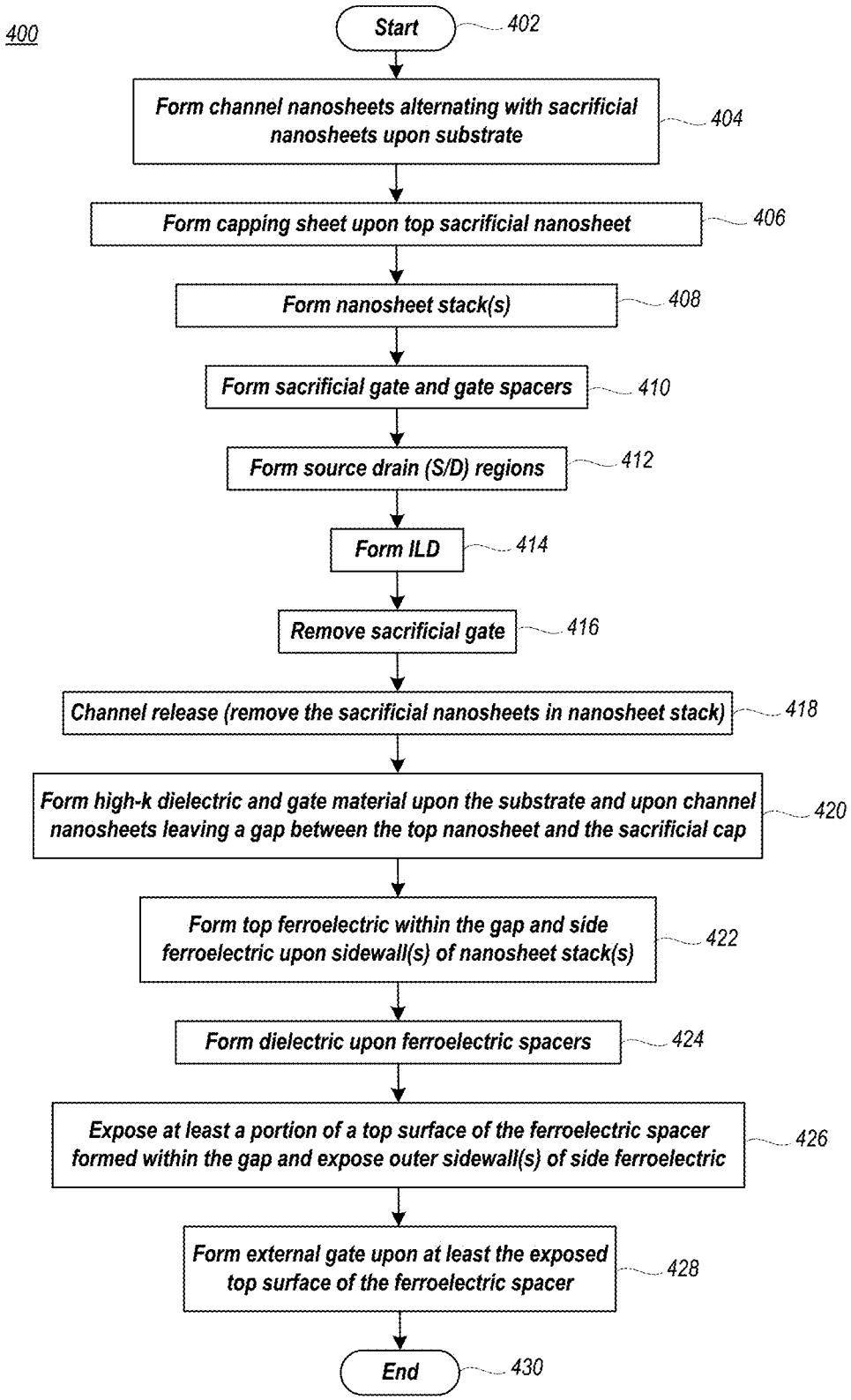
FIG. 14 is a flow diagram illustrating a semiconductor device fabrication method, in accordance with one or more embodiments.

FIG. 14 depicts a flow diagram illustrating a method 400 of fabricating the semiconductor structure 100' (e.g., the structure that includes ferroelectric region 160 between gate 30 and the gate material 150 of nanosheet stack 120 and another ferroelectric region upon one or more sidewalls of the nanosheet stack 120), according to one or more embodiments of the present invention. As depicted in FIG. 14, the method 400 begins at block 402 and continues with forming channel nanosheets 112, 114, and 116 alternating with sacrificial nanosheets 102, 104, 106, and 108 upon substrate 110 (block 404). The thickness of sacrificial nanosheet 108 is generally larger than the thickness of the sacrificial nanosheets 102, 104, and 106 that separates channel nanosheets 112, 114, and 116, or the like.

At block 406, capping sheet 118 is formed upon sacrificial nanosheet 108. At block 408, nanosheet stacks may be patterned between S/D areas. At block 410, a sacrificial gate (not depicted) and gate spacers (not depicted) may be formed. At block 412, source/drain regions 20 are formed upon substrate 110 within the source/rain areas. At block 414, an inter-layer dielectric (not depicted) may be formed and at block 416 the sacrificial gate may be removed.

At block 418, the sacrificial nanosheets 102, 104, 106, and 108 are removed, e.g., released from the channel nanosheets 112, 114, 116 and released from sacrificial cap 118. At block 420, a high-k dielectric layer 140, work function layer 142, and gate material 150 are formed upon the substrate, formed around the channel nanosheets 112, 114, and 116, and formed around the sacrificial cap 118. A gap 160 is formed between the gate material 150 that is formed around channel nanosheet 160 and the gate material 150 that is formed around sacrificial cap 118.

At block 422, a top ferroelectric region 162 is formed within the gap 160 and at least one side ferroelectric region 162 is formed upon one or more sidewalls of the sacrificial nanosheet stack 120'. At block 424, dielectric layer 170 is formed upon at least the ferroelectric regions 162 and/or upon sidewall(s) sacrificial nanosheet stack 120'. Upper surface 175 of dielectric 170 may be above upper surface 163 of ferroelectric region 162.

At block 426, the sacrificial cap 118 and the layers around sacrificial cap 118 (e.g., the high-k layer 140, the work function layer 142, and the gate material 150) are removed to expose the upper surface 163 of ferroelectric region 162 and may expose facing side surfaces 171 of dielectric 170. Upon removal of the sacrificial cap 118 and the layers around sacrificial cap 118, nanosheet stack 120 is formed. Further, in some implementations, portions of dielectric 170 may be removed while portions of dielectric 170 (i.e., dielectric spacers 170) that are upon the sidewalls of nanosheet stack 120 and aligned with the underlying ferroelectric regions 162 may be retained.

At block 428, gate material 30 is formed upon dielectric spacers 170, upon at least a portion 169 of upper surface 163 of ferroelectric region 162. Additionally, gate material 30 may also be formed upon the ferroelectric region(s) 162 located upon the sidewalls of the nanosheet stack 120. Additionally, gate material 30 may be formed upon the high-k material layer 140 above STI regions 122 outside the footprint of the nanosheet stack 120. Method 400 may end at block 430.

The method flow diagrams depicted herein is exemplary. There can be many variations to the diagram or operations described therein without departing from the spirit of the embodiments. For instance, the operations can be performed in a differing order, or operations can be added, deleted or modified. All of these variations are considered a part of the claimed embodiments.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:
1. A nanosheet semiconductor device comprising:
  a first channel nanosheet stack comprising a first plurality of channel nanosheets each connected to a source and connected to a drain;
  a first internal gate surrounding the first plurality of channel nanosheets;
  a first ferroelectric region comprising an inner surface directly upon at least a portion of an outer surface of the first internal gate and sidewalls that are inset from sidewalls of the first internal gate; and a gate directly upon an outer surface of the first ferroelectric region.

2. The nanosheet semiconductor device of claim 1, further comprising:
a dielectric directly upon sidewalls of the first internal gate and directly upon sidewalls of the first ferroelectric region.

3. The nanosheet semiconductor device of claim 2, wherein an upper surface of the dielectric is above an upper surface of the first ferroelectric region.

4. The nanosheet semiconductor device of claim 1, further comprising:
a second channel nanosheet stack comprising a second plurality of channel nanosheets each connected to a source and connected to a drain;
a second internal gate surrounding the second plurality of channel nanosheets;
a second ferroelectric region comprising an inner surface directly upon at least a portion of an outer surface of the second internal gate; and
wherein the gate is further directly upon an outer surface of the second ferroelectric region.

5. The nanosheet semiconductor device of claim 4, wherein sidewalls of the second ferroelectric region are substantially coplanar with sidewalls of the second internal gate region.

6. The nanosheet semiconductor device of claim 4, wherein sidewalls of the second ferroelectric region are inset from sidewalls of the second internal gate region.

7. The nanosheet semiconductor device of claim 1, wherein the inner surface of the first ferroelectric region is directly upon a portion of an upper surface of the first internal gate.

8. A semiconductor device fabrication method comprising:
forming a plurality of channel nanosheets;
forming a sacrificial cap over the plurality of channel nanosheets;
forming a lower internal gate region surrounding the plurality of channel nanosheets;
forming an upper internal gate region surrounding the sacrificial cap;
forming a first ferroelectric region between the lower internal gate region and the upper internal gate region; and
recessing one or more side surface(s) of the first ferroelectric region to be inset relative to respective side surfaces of the lower internal gate region.

9. The semiconductor device fabrication method of claim 8, further comprising:
forming a dielectric directly upon sidewalls of the lower internal gate region, directly upon sidewalls of the upper internal gate region, and directly upon sidewalls of the first ferroelectric region.

10. The semiconductor device fabrication method of claim 9, wherein an upper surface of the dielectric is above an upper surface of the first ferroelectric region.

11. The semiconductor device fabrication method of claim 8, further comprising:
forming a second ferroelectric region directly upon a sidewall of the lower internal gate region.

12. The semiconductor device fabrication method of claim 11, wherein the first ferroelectric region and the second ferroelectric region are simultaneously formed.

13. The semiconductor device fabrication method of claim 8, further comprising:
removing the upper internal gate region and removing the sacrificial cap to expose an upper surface of the first ferroelectric region.

14. The semiconductor device fabrication method of claim 13, further comprising:
forming a gate directly upon at least a portion of the exposed upper surface of the first ferroelectric region.

15. A nanosheet semiconductor device comprising:
a channel nanosheet stack comprising: a plurality of channel nanosheets each connected to a source and connected to a drain;
an internal gate surrounding the plurality of channel nanosheets;
a first ferroelectric region directly upon an upper surface of the internal gate;
a second ferroelectric region directly upon a sidewall of the internal gate; and
a dielectric spacer directly upon the sidewall of the internal gate and aligned with the second ferroelectric region, wherein a sidewall of the dielectric spacer is directly connected to a sidewall of the first ferroelectric region, and wherein a bottom surface of the dielectric spacer is directly connected to a top surface of the second ferroelectric region.

16. The nanosheet semiconductor device of claim 15, wherein a sidewall of the second ferroelectric region is substantially coplanar with a sidewall of the dielectric spacer.

17. The nanosheet semiconductor device of claim 15, wherein sidewalls of the first ferroelectric region are substantially coplanar with sidewalls of the internal gate.

18. The nanosheet semiconductor device of claim 15, wherein sidewalls of the first ferroelectric region are inset from sidewalls of the internal gate.

19. The nanosheet semiconductor device of claim 15, wherein an upper surface of the dielectric spacer is above an upper surface of the first ferroelectric region.

* * * * *